United States Patent [19]

Chan et al.

[11] Patent Number: 5,006,481
[45] Date of Patent: Apr. 9, 1991

[54] METHOD OF MAKING A STACKED CAPACITOR DRAM CELL

[75] Inventors: Tsiu C. Chan, Carrollton; Frank R. Bryant, Denton, both of Tex.

[73] Assignee: SGS-Thomson Microelectronics, Inc., Carrollton, Tex.

[21] Appl. No.: 516,271

[22] Filed: Apr. 30, 1990

Related U.S. Application Data

[63] Continuation-in-part of Ser. No. 443,897, Nov. 30, 1989.

[51] Int. Cl.⁵ .......................................... H01L 21/70
[52] U.S. Cl. .................................. 437/52; 437/47; 437/60; 437/195; 437/919; 357/23.6
[58] Field of Search ................. 437/47, 52, 60, 228, 437/195, 919, 235, 233; 357/23.6, 51; 365/174

[56] References Cited

U.S. PATENT DOCUMENTS

| | | | |
|---|---|---|---|
| 4,355,374 | 10/1982 | Salcai et al. | 365/174 |
| 4,403,394 | 9/1983 | Shepard et al. | 357/23.6 |
| 4,419,743 | 12/1983 | Taguchi et al. | 365/174 |
| 4,475,118 | 10/1984 | Klein et al. | 357/23.6 |
| 4,641,166 | 2/1987 | Takemae et al. | 357/51 |
| 4,855,801 | 8/1989 | Kuesters | 357/23.6 |
| 4,899,203 | 2/1990 | Ino | 357/23.6 |
| 4,905,064 | 2/1990 | Yaba et al. | 357/23.6 |

FOREIGN PATENT DOCUMENTS

| | | |
|---|---|---|
| 0295709 | 12/1988 | European Pat. Off. |
| 74470 | 4/1985 | Japan |
| 0154551 | 6/1989 | Japan |
| 0154552 | 6/1989 | Japan |

OTHER PUBLICATIONS

Koyanagi et al., "Novel High Density Stacked Capacitor MOS RAM", Japanese J. of App. Physics, vol. 18 (1979), Supplement 18-4, pp. 35-42.

Primary Examiner—Brian E. Hearn
Assistant Examiner—T. Thomas
Attorney, Agent, or Firm—Kenneth C. Hill; Richard K. Robinson

[57] ABSTRACT

A capacitor is formed for use with a DRAM storage cell by lying down alternating layers of polycrystalline silicon for the storage node and the ground plate. A buried bit line allows the capacitor area to cover a significant fraction of the cell layout area. The alternating storage node and ground plates of the capacitor are laid down alternately, and connected together as they are formed. The number of interleaved layers which can be used to form the capacitor can easily be varied to suit process requirements.

5 Claims, 5 Drawing Sheets

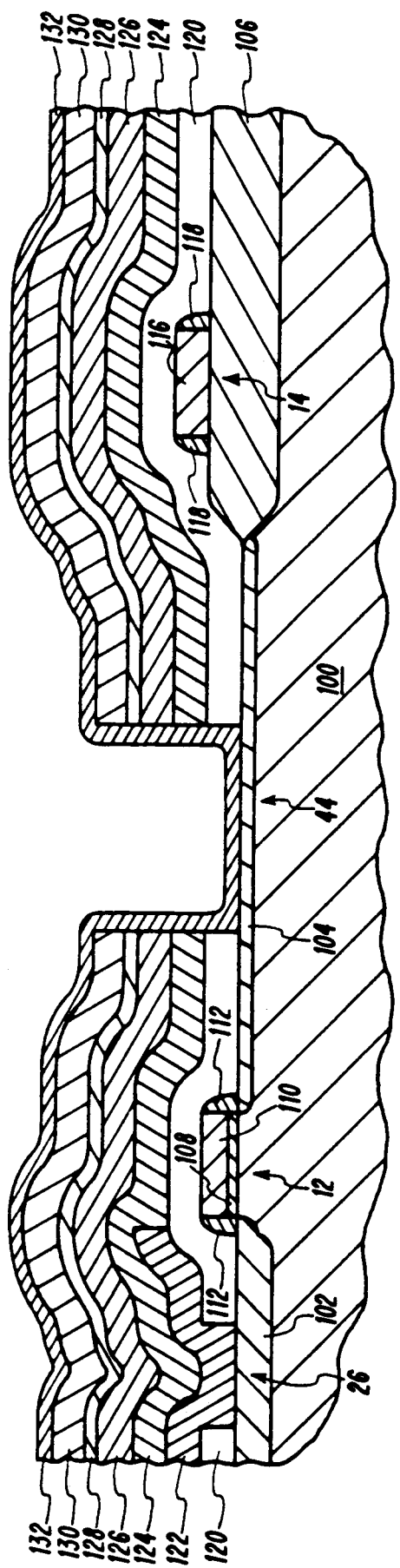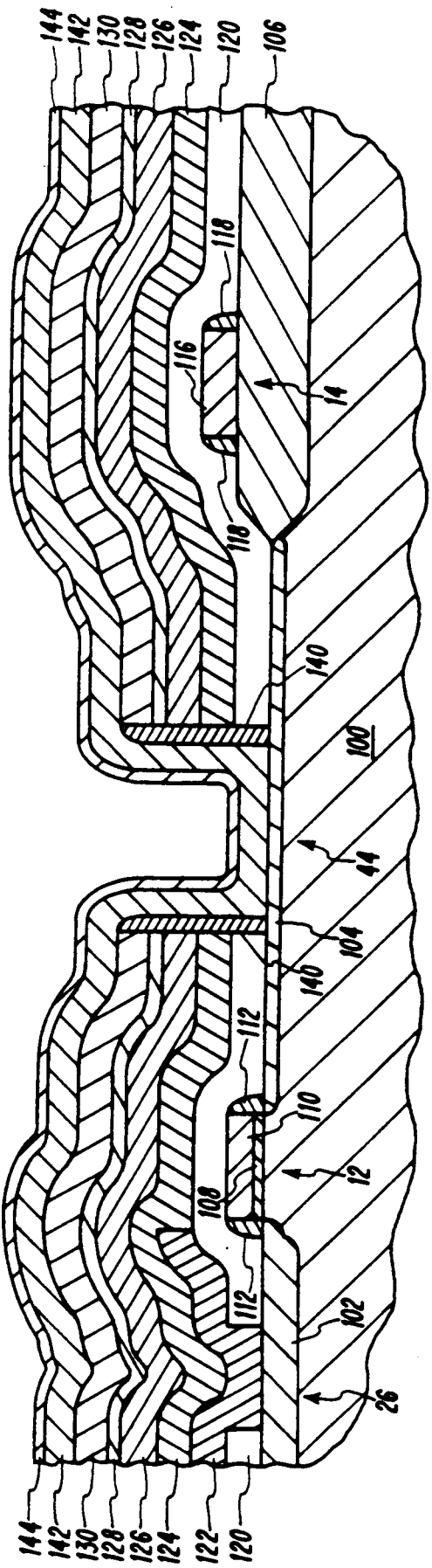
FIG. 4
FIG. 6

METHOD OF MAKING A STACKED CAPACITOR DRAM CELL

CROSS-REFERENCE TO RELATED APPLICATION

The present application is a continuation-in-part of U.S. application Ser. No. 07/443,897, entitled CAPACITOR FOR DRAM CELL, filed Nov. 30, 1989, by Chan et al., and assigned to the assignee hereof, which is incorporated by reference hereinto.

BACKGROUND OF THE INVENTION

1. Field of the Invention:

The present application relates generally to semiconductor circuit structures and methods, and more specifically to a method for fabricating a DRAM cell capacitor and the structure formed thereby.

2. Description of the Prior Art:

Dynamic random access memories (DRAMs) are formed using cells having a single transistor and one capacitor. To enhance device performance, the capacitance of the capacitor should be made as large as possible. This can be accomplished by increasing the plate area of the capacitor, decreasing the plate spacing, or increasing the dielectric constant of the dielectric between plates.

Given a best available dielectric constant for the dielectric and minimum plate spacing, increased capacitance is achieved by increasing the plate area of the capacitor. Thus, the capacitor should occupy a space which is as large as possible on the surface of the DRAM. However, in order to achieve high density for the device, it is necessary to shrink the individual cell size as much as possible. This tends to decrease the capacitor plate area, thereby decreasing capacitance.

Several different approaches have been taken to increase the available capacitor plate area within the constraints of a minimal cell size. One approach is to form capacitor plates along vertical sidewalls, such as along the sidewalls of a trench cut into a substrate. A second approach is to form the capacitor above certain device features such as bit lines and transfer gates. This approach allows capacitors to cover a larger percentage of the surface area of each DRAM cell. Examples of the second approach can be found in the following papers: A NEW STACKED CAPACITOR DRAM CELL CHARACTERIZED BY A STORAGE CAPACITOR ON A BITLINE STRUCTURE, 1988 IEDM Proceedings, pages 596-599; and STACKED CAPACITOR CELLS FOR HIGH-DENSITY DYNAMIC RAMS, 1988 IEDM Proceedings, pages 600-603.

A third approach, which can be combined with the second approach just described, is to form a multiple plate capacitor. This provides more plate area, and hence capacitance, for a given cell layout area. An example of such approach is described in 3-DIMENSIONAL STACKED CAPACITOR CELL FOR 16M AND 64M DRAMS, 1988 IEDM Proceedings, pages 592-595. The device structure described in this paper forms layers of storage node capacitor fins interdigitated with ground plate fins.

The method for forming a multiple plate capacitor in the paper cited above is cumbersome, and it is difficult to verify the quality of the capacitor formed using that technique. As shown in FIG. 1 of the cited paper, it is necessary to etch away intermediate layers from between the storage node capacitor plates, form a dielectric, and then form the capacitor ground plates between the different storage node plates. It is difficult to ensure the quality of the dielectric and ground node plates in the small spaces between the storage node plates.

It would be desirable to provide a method for providing a high capacitance capacitor consistent with current process technologies. It would further be desirable for such a capacitor to be reliable.

SUMMARY OF THE INVENTION

It is therefore an object of the present invention to provide an improved capacitor for use with a DRAM cell which provides a large capacitance for a given cell layout size.

It is another object of the present invention to provide such a capacitor which can be formed using techniques consistent with current process technologies.

It is a further object of the present invention to provide such a capacitor which is reliable in operation.

Therefore, according to the present invention, a capacitor is formed for use with a DRAM storage cell by laying down alternating layers of polycrystalline silicon for the storage node and the ground plate. A buried bit line allows the capacitor area to cover a significant fraction of the cell layout area. The alternating storage node and ground plates of the capacitor are laid down alternately, and connected together as they are formed. The number of interleaved layers which can be used to form the capacitor can easily be varied to suit process requirements.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 2-8 illustrate various processing steps used to form a capacitor according to the present invention.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
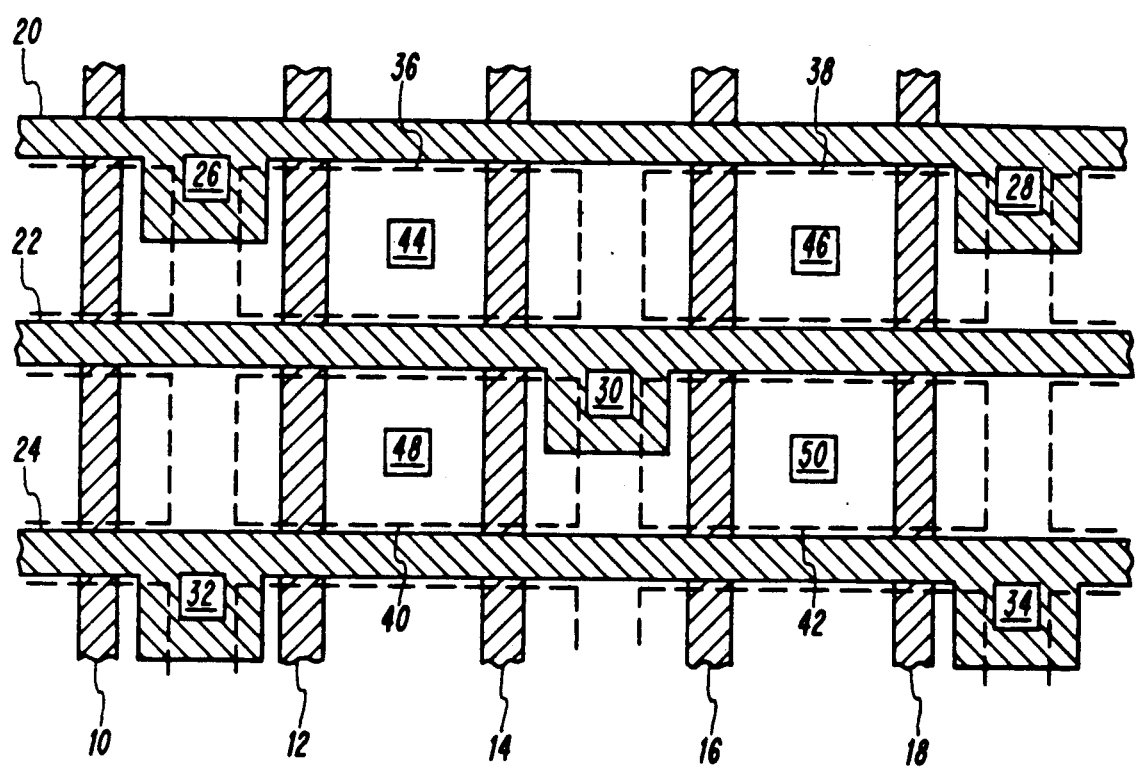
FIG. 1 illustrates a layout of a portion of a DRAM array formed according to the present invention.

Referring to FIG. 1, a portion of a DRAM device layout is shown. Word lines 10-18 travel vertically as shown in FIG. 1, with bit lines 20, 22, 24 passing horizontally. Bit lines 20, 22, 24 make contact to underlying active areas at contact regions 26-34.

Capacitors 36-42 are shown in dotted outline, and make contact to the underlying active regions through contacts 44-50, respectively. As can be seen in FIG. 1, the capacitors overlie the adjacent word lines and a portion of the adjacent bit lines.

The layout of FIG. 1 requires that the word lines 10-13 be fabricated below the capacitor plates 36-42 in order to allow for increased capacitor plate area. The capacitors 36-42 also overlap a portion of the bit lines 20-24 where they widen in order to make contacts 26-34. The capacitors 36-42 could overlap more of the bit lines 20-24 if design tolerances allowed for such overlap.

FIGS. 2-8 show steps of a process flow suitable for forming the DRAM layout of FIG. 1. These drawings represent a cross-section which is not a straight line as seen on the plan of FIG. 1. The cross-section includes a bit line contact, such as contact region 26, as well as a capacitor contact such as contact 44. One capacitor, and its associated pass gate (word line) and bit line contact are shown in the cross-sectional drawings. One additional word line, located on field oxide, is also shown in the cross-section.

Figure 2:
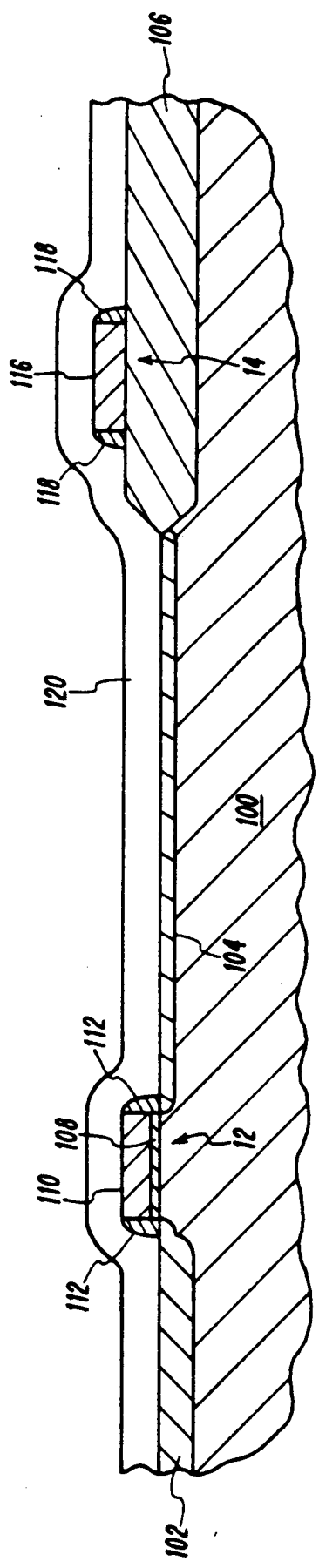

Referring to FIG. 2, a substrate 100 contains active regions 102 and 104 formed as known in the art. Field oxide region 106 is used to separate the active regions of each DRAM cell. On the surface of the substrate 100 are a gate oxide 108 and a polycrystalline silicon gate 110, which define a channel region therebeneath. Sidewall oxide regions 112 are spaced to either side of the polycrystalline silicon gate 110. This structure forms the pass gate for the DRAM cell as known in the art, and preferably is formed as a lightly doped drain (LDD) structure.

An adjoining word line has a polycrystalline silicon gate region 116 with sidewall oxide regions 118. Assuming the word line of polycrystalline silicon gate 110 is word line 12 as shown in FIG. 1, polycrystalline silicon word line 116 corresponds with word line 14. Both polycrystalline silicon regions 110, 116 may be silicided for increased conductivity.

Formation of the word lines, active regions, and so forth shown in FIG. 2 is done according to processes known in the prior art. The active region 102 will eventually become the bit line contact, corresponding to contact 26 of FIG. 1. Active region 104 will eventually become the capacitor contact, corresponding to contact region 44 of FIG. 1. After formation of the word lines and the active regions, oxide layer 120 is formed over the surface of the chip.

Figure 3:
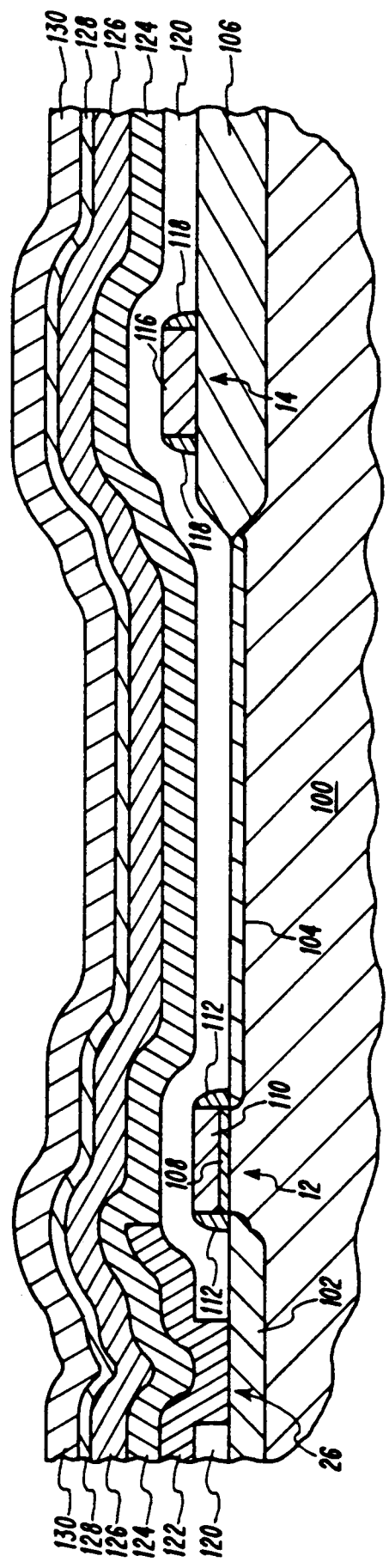

Referring to FIG. 3, bit line contact opening 26 is cut through the oxide layer 120, and a layer of polycrystalline silicon 122 is deposited over the surface of the device. Polycrystalline silicon layer 122 is preferably silicided for improved conductivity, and patterned to form buried bit lines. As described above, that portion of polycrystalline silicon layer 122 shown in FIG. 3 corresponds to the enlarged portion of bit line 20 surrounding contact region 26.

As will be recognized by those skilled in the art, the word lines 12, 14 are typically referred to as the poly-1 layer, with the buried bit line 122 referred to as poly-2. In order to improve performance of the device, the bit line 20 can be strapped with metal at some regular interval, such as every 64 or 128 cells.

An oxide layer 124 is then deposited over the surface of the chip, followed by polycrystalline silicon layer 126. Layer 126 will eventually form part of the ground plate for the capacitor. Dielectric layer 128 is then formed over the surface of the chip, and is preferbly an oxide-nitride-oxide (ONO) layer. Polycrystalline silicon layer 130 is then formed over the surface of the chip. Layer 130 will eventually become part of the storage node of the capacitor. If desired, layer 130 may be made thin, on the order of 500 angstroms.

Referring to FIG. 4, an opening is cut through layers 120, 124, 126, 128, and 130 to form contact opening 44. A layer of thermal oxide 132 is then grown over the surface of the chip, preferably to a thickness of at least 500 angstroms.

Figure 5:
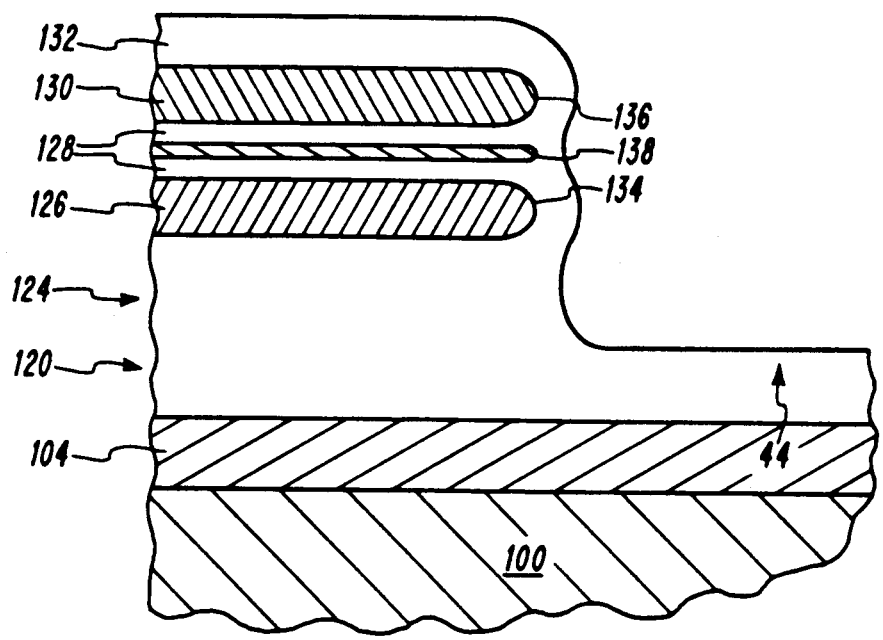

FIG. 5 illustrates what occurs when the thermal oxide layer 132 is grown along one side of the contact opening 44. Insulating layer 128 is comprised of two oxide layers 134, 136 sandwiching nitride layer 138. As shown in FIG. 5, formation of oxide layer 132 results in the formation of a small bird's beak between polycrystalline silicon layer 126 and nitride layer 138, and between polycrystalline silicon layer 130 and nitride layer 138. The effect of these bird's beaks is to separate the polycrystalline silicon layers 126, 130 at their edges, where electric fields are generally most intense.

If the high temperature oxide growth step is not desired, a lower temperature CVD oxide can be deposited instead. Although the bird's beak structures are not formed, an adequate insulating layer is still provided.

Referring to FIG. 6, thermal oxide layer 132 is anisotropically etched back to create sidewall regions 140 around the contact opening 44. The etch back should be complete to ensure that no oxide remains on polycrystalline silicon layer 130 or in the bottom of the contact opening 44.

Polycrystalline silicon layer 142 is then deposited over the surface of the device, making contact with active region 104. Dielectric layer 144 is then formed. Layer 144 consists of a grown oxide layer covered by a deposited nitride layer, forming the first two layers of an ONO dielectric structure.

Figure 7:
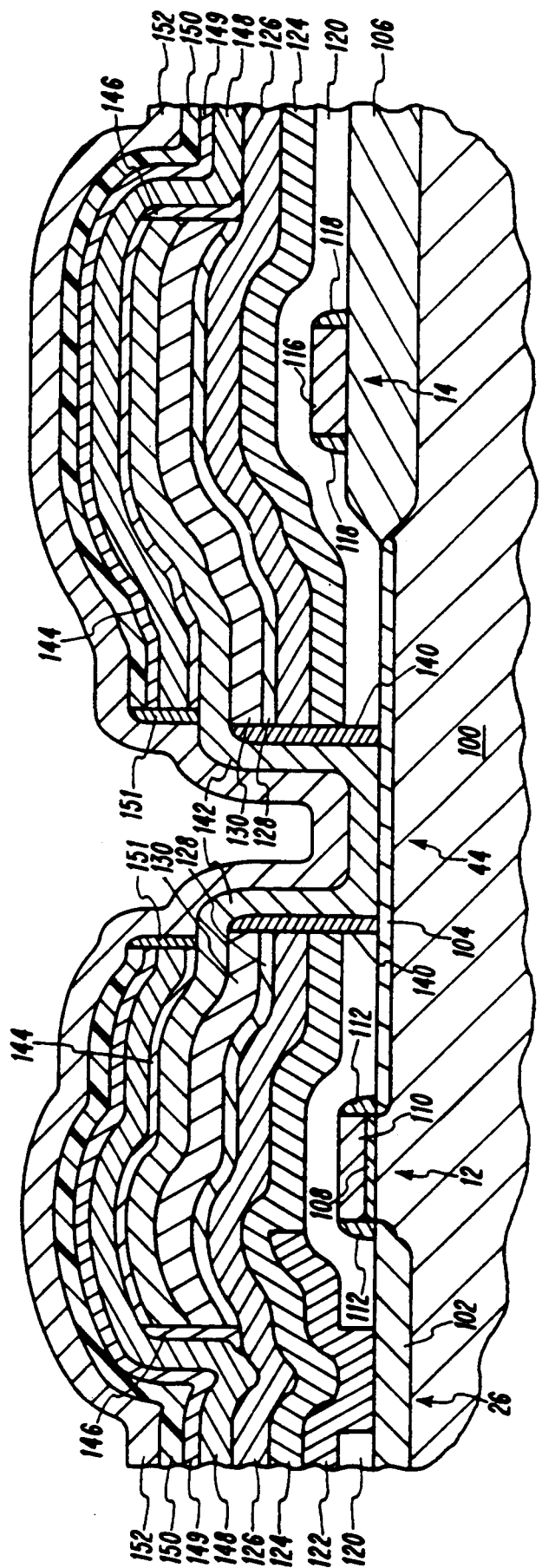

Referring to FIG. 7, the capacitor is patterned and etched to expose polycrystalline silicon layer 126. A layer of oxide is then grown to complete the ONO dielectric layer. This oxide growth step also forms oxide sidewalls 146 as described in connection with FIG. 5. Layers 130 and 142, which function as a single polycrystalline silicon layer, have now been defined to form part of the charge storage plate for the capacitor.

The masking step introduced by the just described procedure is not a critical masking step, in that is alignment tolerance is large. If it is undesirable to introduce the extra mask step, an alternative technique can be used. This alternative is the same self-aligned technique used to form the sidewall regions 140 within the contact opening 44.

In the alternative technique, dielectric layer 144 is formed as a complete ONO layer. A thin polycrystalline silicon layer (not shown) is deposited over the dielectric layer 144, preferably having a thickness of approximately 500 angstroms. The polycrystalline silicon layer, and layers 144, 142, 130, and 128 are then patterned, masked and etched to define the capacitor charge storage plate. A layer of oxide is then deposited and anisotropically etched to form sidewalls 146. The thin polycrystalline silicon layer acts as an etch stop to protect ONO layer 144 over the capacitor. The thin polycrystalline layer then becomes part of the capacitor ground plate when the next polycrystalline layer is deposited.

Polycrystalline silicon layer 148 is then deposited over the surface of the device, followed by an ONO insulating layer 149. The polycrystalline silicon layer 148 makes contact with polycrystalline silicon layer 126, and becomes another portion of the ground plate of the capacitor. A thin (500 angstroms) polycrystalline silicon layer 150 is deposited over the chip, and serves the same function as layer 130. A masking step and anisotropic etch is then used to remove the polycrystalline silicon layer 150, ONO layer 149, the polycrystalline layer 148, and the ONO layer 144 from above the contact region 44. An oxide layer is then deposited and anisotropically etched back to form sidewall regions 151. This isolates ground plate layer 148 from the contact opening. Polycrystalline silicon layer 152 is then deposited over the surface of the chip, resulting in the structure of FIG. 7. The polycrystalline silicon layer 152 will become part of the charge storage node of the capacitor, and is in intimate electrical contact with the polycrystalline silicon layer 142.

Figure 8:
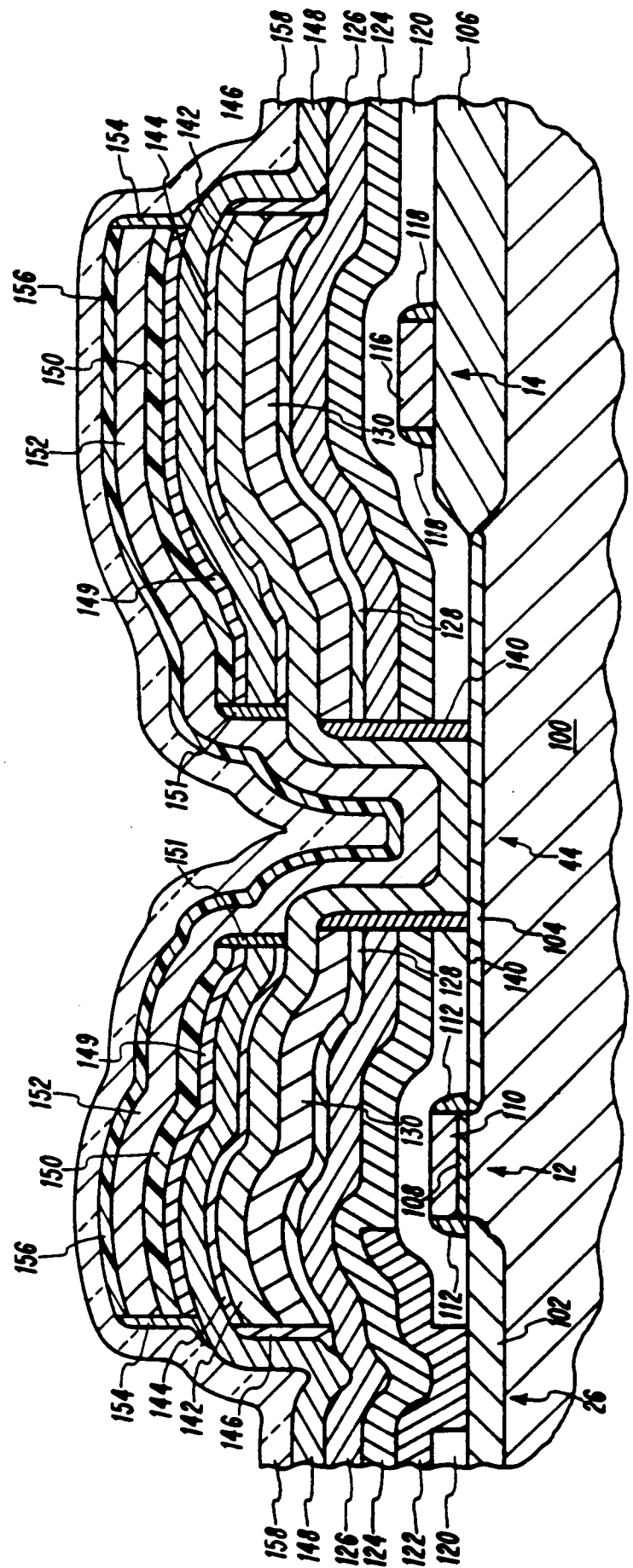

Referring to FIG. 8, polycrystalline silicon layer 152 is etched to form another portion of the charge storage plate for the capacitor. It is preferably etched approximately in alignment with the boundaries of polycrystalline silicon layers 130, 142 and in fact may be etched using the same mask if desired. Sidewall oxide regions 154 are then formed adjacent polycrystalline silicon layer 152, and a dielectric layer 156 is formed over the surface of the chip. As before, the sidewall regions 154 may be formed separately, or as part of an interrupted ONO process which simultaneously forms the sidewall regions 154 as described above. If the sidewalls 154 are formed as part of the ONO process, dielectric layer is then etched using the same mask which was used to etch dielectric layer 144, to expose portions of the ground plate polycrystalline silicon layer 148. Polycrystalline silicon layer 158 is then formed over the surface of the device, making electrical contact with layer 148. As can be seen in FIG. 8, polycrystalline silicon layers 126, 148, and 158 form a ground plate for the capacitor, and combined polycrystalline silicon layers 150 and 152 and the combined layers 130 and 142 form the charge storage node of the capacitor. The charge storage node of the capacitor is in contact with active region 104, and charge may be stored thereon, or the status of the capacitor read, through pass gate 12 onto bit line 122.

Processing steps subsequent to those shown in FIG. 8 are the same as those known in the art, and include deposition of an oxide layer, bit line strapping with metal lines if desired, and passivation.

If desired, additional layers of the capacitor can be formed on the structure shown in FIG. 8. The same set of processing steps is repeated as many times as desired, and includes generally the etching of layers 156 and 158 within the contact opening 44, formation of a dielectric layer, deposition of another polycrystalline silicon layer to form another layer of the charge storage node of the capacitor. In the preferred embodiment, regardless of the number of layers, the top polycrystalline silicon layer of the capacitor is preferably a ground plate layer in order to reduce noise due to cross-coupling of signal lines.

Since the bit lines are buried, the ground plate of the capacitor, represented by layers 126, 148, and 158, can be made continuous over the entire surface of the device. The only exceptions to the continuity of the ground plate are the charge storage plate contact openings 44, and any openings which need to be made to overlying metal lines (not shown) in order to strap the bit lines. This nearly continuous capacitor ground plate greatly minimizes noise on the device, resulting in improved performance.

It will be appreciated that the method described above provides for a multi-layer capacitor with interdigitated charge storage plates and ground plates. All of the process steps are compatible with current process technologies. If self-aligned methods are used to produce the capacitor dielectric layers and sidewalls on the various polycrystalline silicon layers, a minimum number of additional mask steps are introduced. Thus, a capacitor having a greatly improved capacitance is provided with a relatively minimal addition to process complexity.

While the invention has been particularly shown and described with reference to a preferred embodiment, it will be understood by those skilled in the art that various changes in form and detail may be made therein without departing from the spirit and scope of the invention.

What is claimed is:

1. A method for forming a capacitor for an integrated circuit device, comprising the steps of:
    forming a first ground plate of polycrystalline silicon;
    forming a first insulating layer over the first ground plate;
    forming an opening to a substrate;
    forming a first charge storage plate of polycrystalline silicon over the first insulating layer, wherein the first charge storage plate contacts the substrate through the opening;
    forming a second insulating layer over the first charge storage plate;
    forming a second ground plate of polycrystalline silicon over the second insulating layer, wherein the second ground plate makes electrical contact with the first ground plate;
    forming a third insulating layer over the second ground plate;
    forming a second charge storage plate of polycrystalline silicon over the third insulating layer, wherein the second charge storage plate makes electrical contact with the first charge storage plate;
    forming a fourth insulating layer over the second charge storage plate; and
    forming a third ground plate of polycrystalline silicon over the fourth insulating layer, wherein the third ground plate makes electrical contact with the second ground plate.

2. The method of claim 1, wherein each of the insulating layers comprises an oxide-nitride-oxide structure.

3. A method for forming a DRAM cell for a semiconductor integrated circuit, on a semiconductor substrate comprising the steps of:
    forming a pass transistor having first and second source/drain regions;
    forming a bit line in contact with the first source/drain of the pass gate;
    forming a first insulating layer over the surface of the device;
    forming a first ground plate of polycrystalline silicon;
    forming a second insulating layer over the first ground plate;
    forming an opening to the substrate through the first insulating layer, wherein the opening exposes the second source/drain region;
    forming a first charge storage plate of polycrystalline silicon over the second insulating layer, wherein the first charge storage plate contacts the second source/drain region through the opening;
    forming a third insulating layer over the first charge storage plate;

forming a second ground plate of polycrystalline silicon over the third insulating layer, wherein the second ground plate makes electrical contact with the first ground plate;

forming a fourth insulating layer over the second ground plate;

forming a second charge storage plate of polycrystalline silicon over the fourth insulating layer, wherein the second charge storage plate makes electrical contact with the first charge storage plate;

forming a fifth insulating layer over the second charge storage plate; and forming a third ground plate of polycrystalline silicon over the fifth insulating layer, wherein the third ground plate makes electrical contact with the second ground plate.

4. The method of claim 3, wherein the bit line is formed from silicided polcrystalline silicon.

5. The method of claim 3, wherein each of the insulating layers comprise an oxide-nitride-oxide structure.

* * * * *